United States Patent [19]

Pagnol et al.

[11] Patent Number: 4,759,735

[45] Date of Patent: Jul. 26, 1988

[54] SOLAR CELL POWERED BEACON

[76] Inventors: Fréderic Pagnol, Domaine de l'Etoile, 06610 La Gaude; Claude Ratti, 4, Avenue Jacques Abba, 06320 Cap D'Ail, both of France

[21] Appl. No.: 912,499

[22] Filed: Sep. 29, 1986

Related U.S. Application Data

[63] Continuation-in-part of Ser. No. 644,051, Oct. 23, 1984, abandoned.

[30] Foreign Application Priority Data

Oct. 24, 1983 [FR] France .................. 83-17026

[51] Int. Cl.$^4$ ............... B63B 22/00; B63B 45/00; F21L 13/00
[52] U.S. Cl. ..................... 441/16; 136/246; 136/251; 136/291; 136/293; 340/331; 340/815.15; 340/981; 340/982; 340/985; 362/183
[58] Field of Search ............... 136/291, 293, 251, 246; 362/183; 340/985, 981, 982, 815.15, 331; 441/16

[56] References Cited

U.S. PATENT DOCUMENTS

| | | | |
|---|---|---|---|
| 3,603,952 | 9/1971 | Smith | 340/539 |
| 3,696,286 | 10/1972 | Vle | 323/15 |
| 3,698,025 | 10/1972 | Worobel | 441/16 |
| 4,491,681 | 1/1985 | Kirpich | 136/246 |
| 4,626,852 | 12/1986 | Dodge | 340/985 |

FOREIGN PATENT DOCUMENTS 2115915 9/1983 United Kingdom ............... 136/291

*Primary Examiner*—Aaron Weisstuch
*Attorney, Agent, or Firm*—Charles W. Fallow; Mitchell B. Wasson; Martin P. Hoffman

[57] ABSTRACT

A solar-powered beacon comprises a water-tight caisson housing a battery for storing electricity produced by solar cells atop the beacon. An electronic circuit within the caisson controls operation of the beacon. The caisson material acts as a heat sink for the solar cells, and insulation is provided below the cells to further protect the electronic components.

10 Claims, 4 Drawing Sheets

SOLAR CELL POWERED BEACON

This application is a continuation-in-part of Ser. No. 644,051, filed Oct. 23, 1984 and now abandoned.

The present invention relates to a beacon powered by solar cells.

BACKGROUND OF THE INVENTION

Beacons, in particular marine beacons, whose electrical current power supply is provided by solar cells which supply the electricity from the sunlight they receive are already known.

Beacons of the type heretofore known often have their solar cells fastened by complicated means and are connected by external electrical wiring to the devices they power. Consequently, the known beacons are fragile and have low resistance to the bad weather to which they are often exposed.

SUMMARY OF THE INVENTION

The present invention relates to a beacon whose electrical current supply is provided by solar cells operating on solar energy, the beacon comprising a water-tight caisson having an upper portion with a preferably essentially truncated conical surface. The solar cells are incorporated in the wall of the upper part of the caisson of inside of which are batteries for storing the electricity generated by the cells, as well as the electronic devices needed for the operation of the transmitter of the beacon.

Due to the particulars which distinguish it from those beacons formerly known, the beacon according to the invention has the advantage of being very sturdy and resistant to bad weather, since it constitutes in itself a water-tight chamber inside which all the circuits and electrical and electronic devices are contained and sealed, sheltered from humidity and shocks.

In accordance with one particular embodiment of the invention, the beacon has at the center of its upper part, an electronic device signaling, which can for example be an antenna transmitting electromagnetic waves, or a flasher or blinker. This transmitting device can, for example, be remotely activated by an airplane desiring to land on a runway marked by beacons conforming to the invention.

The upper part of the caisson preferably has the shape of a surface of revolution, for example, a truncated (most often flattened) or a pyramid shape, due to the fact that this type of beacon is principally used in the lower or middle latitudes.

This form has the advantage of preventing materials such as debris, leaves, and dust from settling and remaining on top of the solar cells which could block the sun's rays.

However, it is advantageous, according to the invention, to increase the conicity of the upper part of the beacon when the beacon is to be used in higher latitudes, since at these latitudes the solar rays are more slanted on the horizon, although the beacons always maintain an essentially vertical axis.

According to the invention, the upper surface of the beacon can be subdivided into flat sectors of small size, each of which corresponds to a solar cell or group of cells.

The incorporation of solar cells in the upper wall of the caisson can be accomplished by placing the cells in a known manner, between two plates of glass which are fastened to the upper surface of the beacon with appropriate water-tight seals.

According to one preferred embodiment of the invention, the cells are incorporated into the caisson by being directly encapsulated in a mass of synthetic transparent material such as for example a "doped" polymethylmethacrylate, which has the advantage of being light and strong.

In a variation, the solar cells are connected in groups by being incorporated in an exposed plate of transparent material which can be fastened so that it can be detached (for example by means of screws) from the upper wall of the caisson. In this case, the conductor wires from the group of solar cells are connected to the wires going to the electrical energy storage device and the water-tightness of the caisson is assured by annular seals placed around the electric wires between the wall of the caisson and the plate in which the cells are incorporated.

The lower wall of the plate is preferably made of metal or another good heat-conducting material, and a good heat-conducting material such as a substance with a silicon base is applied between the plate and the wall of the caisson.

According to one preferred embodiment of the invention, the interior space of the caisson is subdivided by an intervening wall into a first space in the vicinity of the lower surface of the beacon, and which holds the assembly of electrical and electronic devices for storage of electrical energy and operating the beacon, and into a second space which is located between the outer and upper wall of the caisson itself and the intervening wall and which is filled with a heat-insulating material such as a synthetic material foam, this second space being traversed by the electrical connecting wires between the solar cells incorporated in the upper wall of the caisson and the electrical and electronic devices located in the lower space.

Since, according to the preferred embodiment of the invention, the second space located between the upper surface of the caisson and the first space which holds the electronic apparatus can be filled with a heat-insulating material such as a foam of synthetic material, the double advantage arises of thermally insulating the electronic apparatus, certain components of which are heat-sensitive, and of providing great rigidity to the beacon assembly, preventing vibrations or stresses exerted on the body of the beacon during use from causing deterioration of the solar cells or the electrical connections between the cells and the electronic devices.

It is known in practice that during use, the solar cells can reach temperatures ranging up to 90 or 100 degrees C., and that if these temperatures were transmitted to the electronic devices and especially to their transistors and integrated circuits, they can deteriorate and be damaged.

The walls of the caisson can, for example, be made of synthetic materials with a polyester base.

However, when the upper surface of the caisson has a large number of solar cells and the beacon is designed to be used at a latitude with strong solar radiation, it is advantageous, conforming to the invention, to make the upper wall of the caisson and preferably also its lower wall, of a material which is a good heat conductor, such as for example, aluminum, which allows the removal by conduction of the heat emitted at the level of the solar cells, the overheating of which is thereby limited.

The heat thus liberated at the level of the solar cells is conducted toward the base of the caisson, the lower, preferably metal wall of which rests on the ground and assures that the heat liberated at the level of the solar cells is dissipated into the ground.

In this embodiment, when the solar cells are incorporated in small plates, these plates are advantageously made of a material which is a good heat conductor such as aluminum.

This preferred embodiment of the invention simultaneously solves two problems which arise in the manufacture of a high-efficiency compact beacon. In practice, on the one hand, the electronic components of the solar cells are thermally insulated by a large volume of material such as a synthetic foam and, on the other hand, too great an elevation in the temperature of the solar cells is avoided by cooling them by means of the upper heat conductive wall of the caisson which dissipates the heat toward the base of the caisson.

Conforming to the invention, the electrical wiring carrying the current produced by the cells passes directly through the wall of the caisson to be connected inside the caisson to storage batteries and to the electronic devices which the solar cells energize.

Conforming to one preferred embodiment of the invention, the solar cells incorporated into the upper wall of the caisson are electrically connected in series, preferably in groups of four to eight cells, each of the groups being connected to its own voltage converter which supplies the storage batteries of the beacon at the nominal battery voltage.

Conforming to this particular embodiment of the invention, the storage battery is thus charged or supplied by a plurality of power supplies connected in parallel, each of which represents only a limited number of solar cells.

This arrangement, combined with the surface of revolution shape of the beacon, assures smoothing of the average power delivered to the battery as a function of the azimuth of the luminous source.

Moreover, due to this parallel arrangement, deterioration of a solar cell due to shock or impact, or the fact that an object such as a leaf or bird excrement may obscure a solar cell from the solar radiation results in the loss of efficiency of only a limited number of cells, the other groups of solar cells continuing to supply current to the storage battery at its nominal voltage.

This characteristic also assures optimum electrical efficiency for the cell assembly since the groups of cells not supplying any energy do not use any current and thus do not decrease the output of the energy producing cells.

In order to make the invention better understood, several embodiments will now be described as non-limiting examples, with reference to the accompanying drawings.

DETAILED DESCRIPTION OF PREFERRED EMBODIMENTS

Figure 1:
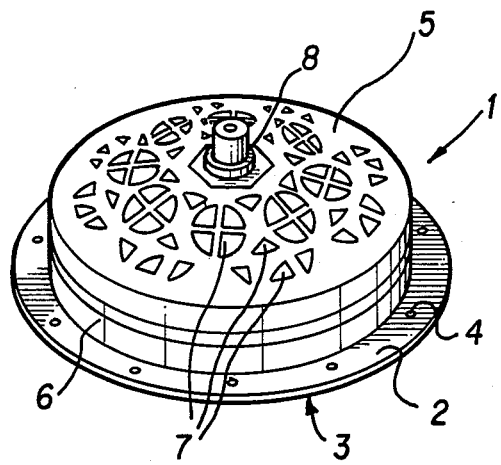
FIG. 1 is a perspective view of a first embodiment of the beacon of the invention.

FIG. 1 shows the closed caisson 1 which, conforming to the invention, encloses, in a sealed water-tight manner, the storage batteries and electronic devices, and which has at its lower periphery a support plate or flange 2 which is connected in a water-tight manner to a base plate 3 by screws 4 shown schematically.

Conforming to the invention, the upper portion of caisson 1, is constituted of a surface with a shallow essentially truncated shape connected to support 2 by an essentially cylindrical side wall 6 which gives the beacon sufficient height to contain storage batteries and electronic devices inside the caisson.

Schematically shown on the surface of upper portion or wall 5 are the solar cells 7 which, in the present case, have in the usual way the shape of a circular sector.

Conforming to the invention, the solar cells 7 are incorporated in the upper portion or wall 5 of caisson 1 by being embedded in transparent resin and thus removed or protected from the effects of the exterior environment.

Solar cells 7 are interconnected to produce sufficient voltage for the electrical connections located inside caisson 1, as well as for the supply wires of the storage batteries and the electronic devices or apparatus contained in the beacon.

Also schematically shown at the top of upper portion 5 is a transmitter 8, which in the present case is a luminous signalling device which sends flashes, in a known manner, by the discharge of the electrical energy stored in a condenser.

Figure 2:
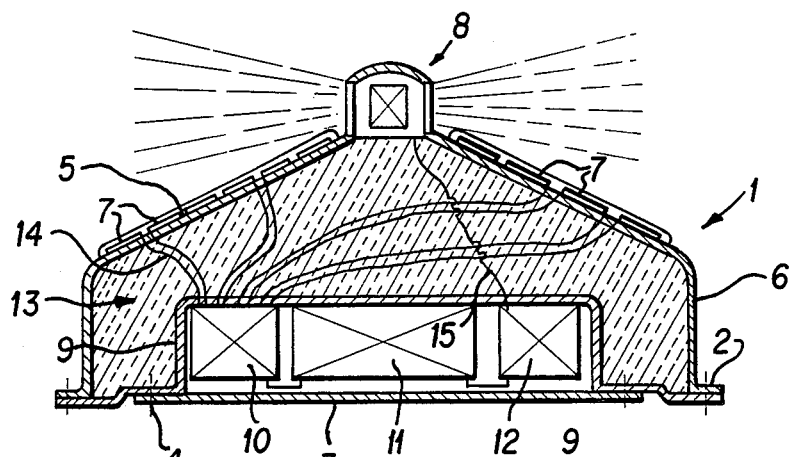
FIG. 2 is a schematic view in section showing a second embodiment of the beacon of the invention.

Another embodiment of the beacon conforming to the invention is shown in section at FIG. 2.

In this embodiment, there is again a caisson 1 at the upper part 5 of which are incorporated solar cells 7, the transmitter 8 being placed at the top of the central part of caisson 1.

In this embodiment, an intermediate wall 9, is connected and sealed at its periphery to support flange 2 of caisson 1, and subdivides the interior of the caisson into two distinct spaces or chambers. This intermediate wall has a bottom peripheral flange, a side wall spaced inwardly of side wall 6, and a top spaced from the upper wall 5 of the caisson.

The periphery of the flange of intermediate wall 9 can be sealed to support flange 2 of the caisson either by gaskets and screws whose axes are shown schematically on FIG. 2 or by simply gluing or cementing.

The lower space delimited by wall 9 is sealed by a bottom plate 3 which is fastened by screws 4, shown schematically.

Thus there is delimited a water-tight space located in the lower part of the beacon which contains voltage converters 10 which supply or charge storage battery 11 at the desired voltage, as well as the battery 11 and electronic apparatus 12 powered by battery 11 which assure the operation of transmitter 8, which in the present case comprises a device transmitting flashes, such as a blinker.

Schematically shown at FIG. 2 is insulating material 13, which fills the space delimited by intermediate wall 9 and upper wall 5 of caisson 1. This insulating material can advantageously be a foam of a synthetic material with closed cells which is injected into the space after the electrical connections have been made.

Also schematically shown in FIG. 2 are the electrical wiring connections such as 14, which connect solar cells 7 to voltage converter devices 10, as well as electrical wiring connections 15 which connect transmitter 8 to its electrical operating apparatus 12.

Figure 3:
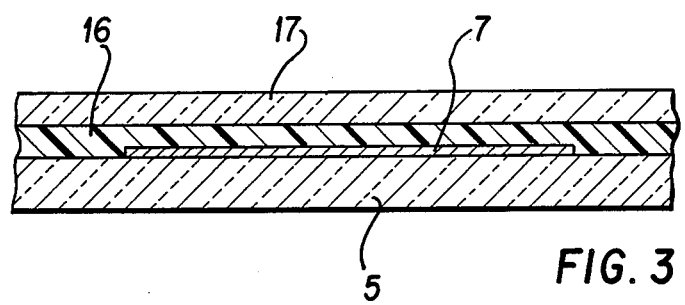
FIGS. 3 and 4 are partial views in section on an enlarged scale showing the solar cells incorporated in the upper surface or wall of the caisson of the beacon.
Figure 4:
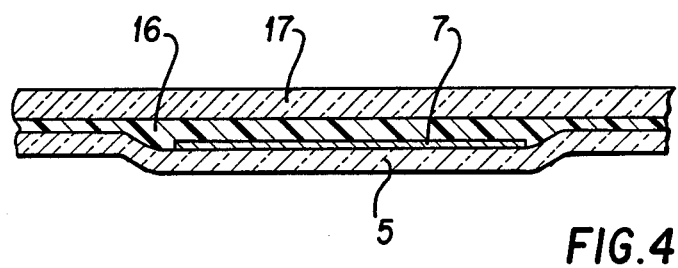

FIGS. 3 and 4 show two embodiments of the incorporation of solar cells 7 in the wall of the upper part of caisson 1.

The solar cell 7 is fastened on wall 5 of the caisson, for example, by cementing, after the electrical connections between the different solar cells have been made in conformity with the required wiring.

Solar cells 7 are then covered with a layer 16 of transparent synthetic material which can be rigid but which is preferably flexible.

This first layer 16 is itself covered with a second layer 17 of a hard transparent synthetic material which assures the protection of the solar cells while allowing solar radiation to pass through.

Conforming to the invention, the caisson can be made from a synthetic material such as reinforced polyester resin.

However, according to one preferred embodiment of the invention, wall 5 of the caisson is made of a material which is a good conductor of heat such as, for example, aluminum, so as to allow easier evacuation or dissipation of the heat which is given off by solar cells 7.

In this case, it is equally preferable, conforming to the invention, to make intermediate partition 9 and bottom wall 3 which closes the space containing the electrical and electronic devices, also from a material which is a good conductor of heat, such as aluminium.

In the embodiment of FIG. 4, the solar cells are disposed in shallow recesses formed in the surface of the wall of the caisson, for example, by stamping the metal wall of the caisson.

The synthetic material which constitutes the layer 16 which covers the solar cells is, for example, a transparent silicone resin or acrylic polymerized by catalysis or by photopolymerization, which gives layer 16 flexibility.

Surface layer 17 can be of a tansparent polycarbonate or a resin of the same type as that of layer 16.

Figure 5:
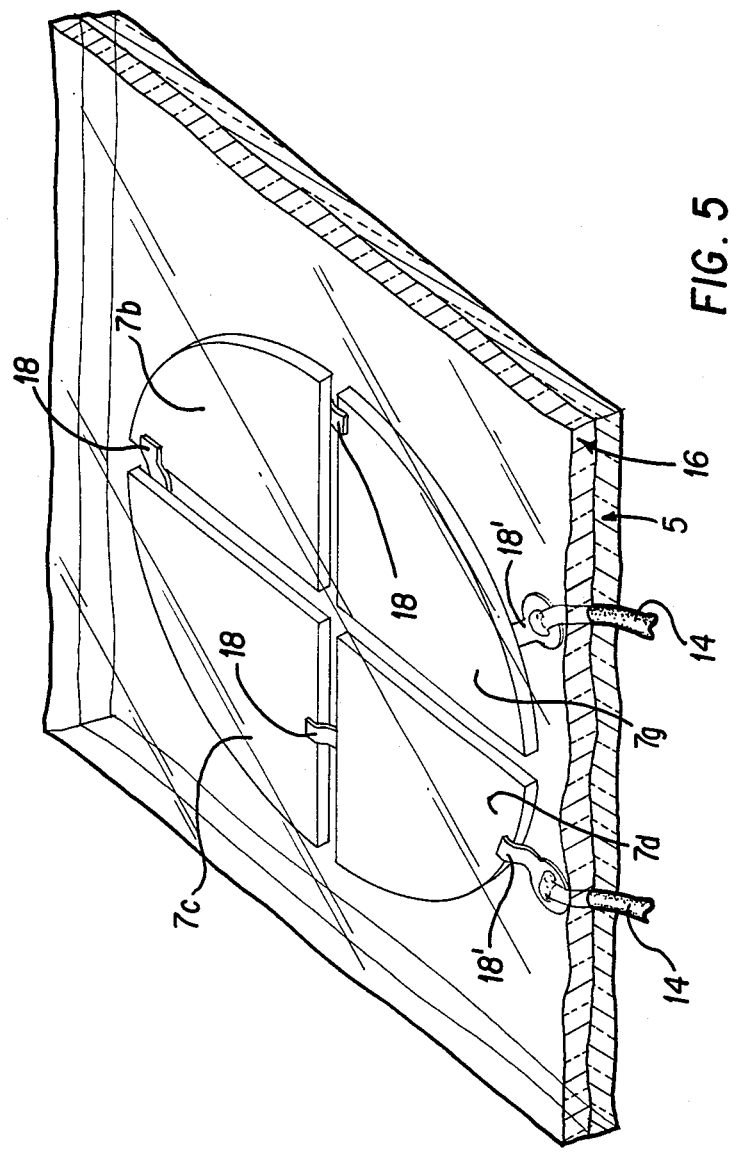
FIG. 5 is a partial view in perspective showing four solar cells electrically interconnected to form a group.

FIG. 5 shows four solar cells 7a, 7b, 7c, and 7d connected according to one particular embodiment of the invention, by being fastened on wall 5 of the upper part of caisson 1.

The solar cells, each of which have the shape of a quarter of a circle, are first connected in series by electrical connectors 18 which connect the upper surface of one solar cell to the lower surface of the following cell. As shown, the connectors are thin flat conductors which extend between the upper and lower surfaces of adjacent cells. Similar electrical connections 18' connect the end solar cells 7a and 7d of a group to conductors 14 which traverse through wall 5 of caisson 1 and are connected to a voltage convertor 10.

After having been thus electrically connected, solar cells 7a, 7b, 7c, and 7d are fastened on wall 5 by adhering or cementing, and are covered with a layer 16 of transparent synthetic material, which can in turn be covered with a layer 17 of harder transparent synthetic material, as previously explained.

Figure 6:
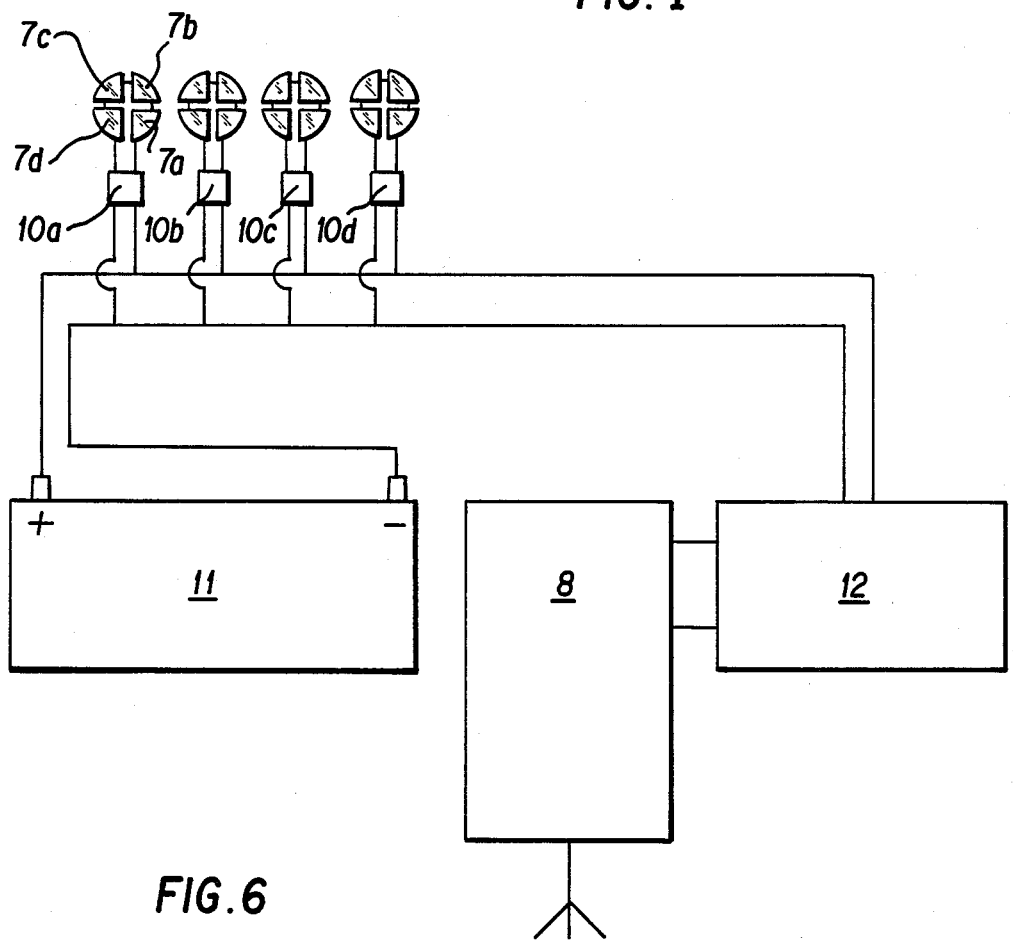
FIG. 6 is an electrical schematic for the beacon according to the invention.

FIG. 6 schematically shows the electrical system of a beacon according to one particular embodiment of the invention.

As shown at FIG. 6 there are a plurality of groups of solar cells 7a, 7b, 7c, 7d, each of these groups being connected respectively to a voltage convertor 10a, 10b, 10c, 10d. The voltage converters are each parallel connected to storage battery 11 and supply current at the nominal voltage of the battery.

An electronic device 12, which is powered by storage battery 11, assures the operation of transmitter 8.

While FIG. 6 shows only four groups of solar cells, it is to be understood that the beacon has a much larger number which supply sufficient current to storage battery 11 to maintain the battery charged, even when some of them are out of order either because a solar cell has been damaged or because a foreign body prevents the solar radiation from reaching the cell.

It will be seen that, conforming to the invention, one obtains a water-tight beacon which is compact, all of the parts constituting the beacon being either incorporated into or contained within the truncated part of the caisson.

Of course the shape of the beacon which has been given by way of example is in no way limiting and can undergo any desirable modifications without departing from the scope of the invention.

In particular, as was explained above, the conicity of upper part 5 of the caisson can vary as a function of the latitude at which the beacon is to be used, this truncated part 5 being flatter if the beacon is to be used in equatorial regions, and more pointed if the beacon is to be used in regions nearer the poles of the earth.

In the same way, of course, the height of the cylindrical part depends on the space occupied by the electrical or electronic components located inside the beacon.

Finally, it is clear that the invention is not limited to any particular kind of beacon and can apply equally well to terrestrial and maritime beacons.

We claim:

1. A solar cell powered signal beacon, comprising a water-tight caisson having an upper wall, battery means within the caisson for storing electrical energy produced by the solar cells, electronic means within the caisson for operating the beacon, a plurality of solar cells incorporated in heat dissipating fashion on the outer surface the upper wall of said caisson, electrical conductors connected to said solar cells, said electrical conductors traversing the thickness of the upper wall of the caisson to the interior thereof, and means for electrically connecting said conductors to said battery and said electronic means.

2. A solar cell powered beacon according to claim 1, in which at least one of the solar cells is incorporated in a small plate removably secured on said outer surface of said upper wall of the beacon, and an annular seal around the conductors and between said small plate and the upper wall of the beacon for providing a water-tight seal.

3. A solar cell powered beacon according to claim 2, in which the upper wall of the caisson in which the solar cells are incorporated comprises, a wall of essentially truncated cone shape.

4. A solar cell powered beacon according to claim 1, having in the center of an upper portion thereof, a transmitter for transmitting a beacon signal.

5. A solar cell powered beacon according to claim 1, wherein the interior of said caisson contains an intermediate wall dividing the interior into an upper space and a lower space and wherein, said battery and said electronic means are located in said lower space, and said upper space is contains a heat-insulating material.

6. A solar cell powered beacon according to claim 5 in which the heat-insulating material comprises a foam of synthetic material.

7. A solar cell powered beacon according to claim 1 wherein at least said upper wall of the caisson is comprised of a material which is a good heat conductor.

8. A solar cell powered beacon according to claim 7 wherein said upper wall of the caisson is comprised of aluminum.

9. A solar cell powered beacon according to claim 1 wherein the solar cells comprise groups of solar cells with the cells of each group electrically connected in series and having an output, a plurality of voltage converter means, one connected to the output of each group of solar cells, said plurality of voltage converter means comprising means for producing a voltage subtantially equal to the nominal voltage of the battery, and being connected in parallel to said battery.

10. A solar cell powered beacon according to claim in which each group is comprised of 4 to 8 solar cells interconnected in series.

* * * * *